United States Patent [19]

Vyas

[11] Patent Number: 5,035,918
[45] Date of Patent: Jul. 30, 1991

[54] NON-FLAMMABLE AND STRIPPABLE PLATING RESIST AND METHOD OF USING SAME

[75] Inventor: Navin N. Vyas, Winston-Salem, N.C.

[73] Assignee: AMP Incorporated, Harrisburg, Pa.

[21] Appl. No.: 343,764

[22] Filed: Apr. 26, 1989

[51] Int. Cl.$^5$ .................. B05D 3/06; B05D 5/12; H01L 21/306

[52] U.S. Cl. ................. 427/53.1; 427/54.1; 427/96; 427/98; 427/125; 156/632; 156/643

[58] Field of Search ............ 427/53.1, 54.1, 125, 427/96, 98, 99; 156/632, 631, 643; 430/297, 326, 325, 945

[56] References Cited

U.S. PATENT DOCUMENTS

| | | | |
|---|---|---|---|
| 4,064,205 | 12/1977 | Landsman | 427/53.1 |
| 4,144,118 | 3/1979 | Stahl | 427/99 |
| 4,388,517 | 6/1983 | Schulte et al. | 427/53.1 |
| 4,414,059 | 11/1983 | Blum | 427/53.1 |
| 4,508,749 | 4/1985 | Brannon et al. | 427/53.1 |
| 4,545,864 | 10/1985 | Richards | 427/125 |
| 4,568,632 | 2/1986 | Blum et al. | 427/53.1 |
| 4,617,085 | 10/1986 | Cole, Jr. et al. | 427/53.1 |
| 4,705,698 | 11/1987 | Van Dine | 427/53.1 |

OTHER PUBLICATIONS

Cole et al., "Laser Photoetching of Polymers", *Mat. Res. Soc. Symp. Proc.*, vol. 72, 1986, pp. 241–245.

Primary Examiner—Michael Lusignan
Assistant Examiner—Marianne L. Padgett
Attorney, Agent, or Firm—William B. Noll

[57] ABSTRACT

This invention is directed to a non-flammable plating resist with improved adhesion and edge covering characteristics which permits its selective removal by an ordinary laser ablation process or an energy efficient laser assisted process, and to the preferred method in using same to selectively plate a metal substrate, such as a nickel plated, electrically conductive metal with a precious metal. The preferred method comprises the steps of applying a thin uniform layer of such resist onto the substrate and drying the same in situ to a thickness greater than 100 microinches and less than 500 microinches, and drying same in situ, where such resist (a) is resistant to deterioration by chemical plating solutions of such precious metal, (b) is readily strippable in alkaline solutions, and (c) has a flashpoint in excess of 100° F. A preferred formulation for such resist comprises, by weight, the following:

| | |
|---|---|
| Styrene acrylic co-polymer suspension | 61.5% |
| Butyl cellosolve | 3.1% |
| Butyl carbitol | 7.4% |
| Water, essentially the balance. | |

Thereafter, selected areas of said resist coated substrate are subjected to a controlled excimer laser pulse to remove such resist within said areas by an ablation process or a "patch blow off" energy efficient process, followed by plating the exposed areas of said substrate with a precious metal, and stripping said resist from the remaining portions of said metal substrate.

5 Claims, No Drawings

NON-FLAMMABLE AND STRIPPABLE PLATING RESIST AND METHOD OF USING SAME

RELATED APPLICATIONS

This invention represents an improvement on co-pending application, Ser. No. 232,357 directed primarily to a waterborne plating resist. More particularly, this invention relates to a plating resist which is more effective by virtue of its improved handling property of a flashpoint in excess of 100° F., when practicing the invention in co-pending application, Ser. No. 180,417, where selective plating is achieved by the technique of laser ablation of the resist in certain areas, followed by plating the exposed areas of the substrate.

FIELD OF THE INVENTION

This invention is directed to an improved plating resist, and to the method which includes the selective removal thereof for subsequent plating of the underlying substrate by a precious metal.

BACKGROUND OF THE INVENTION

The present invention relates to a method which allows for the selective plating of a metal substrate, such as an electrical contact. The selective plating thereof, such as by plating with a precious metal, is achieved herein by first applying to all surfaces of such contact a thin coating of a sprayable styrene-acrylic co-polymer resist, drying the resist, preferably followed by the selective removal thereof by a technique called laser ablation, precious metal plating of such selective areas, and removal of the remaining resist from such contact. However, the plating resist of this invention is also applicable to other plating methods such as by the use of a mask or other means for selective plating as known in the art.

A preferred embodiment of this invention is the selective plating of electrical terminals. Typically, such terminals are stamped and formed from metal strip and are attached to a carrier strip which is useful for strip feeding the terminals through successive manufacturing operations. One necessary manufacturing operation involves plating; i.e., electroplating, the electrical contact surfaces of the strip fed terminals with precious metal or semi-precious metal, such as gold or alloys thereof. Such metals are characterized by good electrical conductivity and little or no formation of oxides that reduce said conductivity. Therefore these metals, when applied as plating, will improve conductivity of the terminals. However, the high cost of these metals has necessitated precision deposition onto the contact surfaces of the terminals, and not on surfaces of the terminals on which plating is not necessary. By being able to initially control the selective resist removal procedure, one can ultimately control and limit the application of the precious metals.

Ablation is defined as the process of removal of a part such as by melting or vaporization. The laser is the mechanism by which one may achieve the selective melting or vaporization. By the use of different lasers, particularly ones utilizing a broadly differing wavelength, the general process of laser ablation is affected. For example, by the use of an excimer laser, operating in the U.V. range, coupled with a resist essentially transparent to the wavelength of such laser, and a metal substrate from which the resist is to be removed and which absorbs such wavelength, as taught in co-pending application, Ser. No. 180,417, a different laser assisted material removal process is observed. The latter process, which is more energy efficient, may be termed "patch blowoff." That is, rather than melting or vaporizing the resist, an interesting phenomena occurs at the resist/substrate interface resulting in the overlying resist being blown off, essentially as solid particles. Thus, while laser ablation has been broadly used to define any process where a laser is used to assist in a material removal process, it will be appreciated that the certain parameters applied will render the various approaches quite distinctive.

Returning now to the broad concept, it can be acknowledged that selective removal of a resist may be accomplished by the technique known as laser ablation. Reports have appeared in the literature regarding attempts at laser ablation of polymer coatings on metals, and regarding methods of multi-shot removal of polymer coatings on non-metals. R. Srinivasan et al, in the *JAP* 59, 3862 (2986) and *JVST*, B1, 923 (1983) describe, for example, the use of excimer laser wavelengths which are strongly absorbed directly in the polymer itself to achieve removal of polymer by chemical bond-breaking or heating to vaporization, or a combination of both. However, the authors found that polymer ablation occurs when the laser light is absorbed within about the first 0.2 micron or less of the polymer surface. Then only that polymer material within the characteristic absorption depth was removed. In order to remove a thicker polymer film, such as is necessary for most electroplating requirements, multiple laser shots would be required. The use of multiple shots is much less desirable than single shot removal. One problem associated with the method of Srinivasan et al, wherein the laser light is directly absorbed in the polymer, is that choosing a laser wavelength too strongly absorbed in the polymer necessarily implies a small absorption depth and small thickness removed. On the other hand, choosing a wavelength too weakly absorbed in the polymer precludes depositing sufficient energy per unit volume of polymer to achieve ablation. The compromise value between these extremes dictates that no more than about 0.3 micron per pulse can be removed in the best case. Cole et al, in *Mat. Res. Soc. Symp. Proc.* 72, 241 (1986), concur with Srinivasan et al in this finding The above process represents the current state of the art on excimer laser ablation of polymers.

In U.S. Pat. No. 4,671,848 to Miller et al, a method for the removal of a dielectric coating from a conductor, by means of a focused, high energy radiation source, is taught. More particularly, in said method a laser source is focused to a point above the coating which results in a plasma ionized region being formed. As a consequence, the coating is removed in a preselected region on the underlying conductor. In other words, the laser ablation depends on absorption of laser light by ionized air or other plasma and transmission to the dielectric. A difficulty of this method is the ability to control and adjust the air breakdown so as to ensure there is no damage to the conductor, i.e. underlying substrate, and to achieve removal of the residual layer. Another difficulty is that only a small area corresponding to the tight focus region can be removed on each shot. Miller et al state that extended areas are to be ablated by multiple shots while moving the workpiece, or the laser focus.

Notwithstanding such prior art teachings, co-pending application, Ser. No. 180,417 discovered, among other features, a more energy efficient laser process alternative to complete ablation of the material being removed. A single excimer laser shot which is not appreciably absorbed by the coating material penetrates through the entire thickness of the coating and causes heating of the metal substrate surface. The heated metal substrate causes vaporization of a thin layer of the coating material next to the metal, thereby destroying the bond of the coating to the metal and providing expanding gasses which cause the blowoff of a patch of coating material covering the total area of the exposed region. The entire thickness of the coating in the patterned exposure area is thereby removed with only a single laser shot with the utilization of only a fraction of the energy required to volatilize the entire volume of the material so removed.

Thus, an important recognition to come from the work of such co-pending application was the criticality in correlating the operating parameters and characteristics of the laser with the properties and characteristics of the plating resist and the properties and characteristics of the underlying metal substrate. It is known from such prior work that the resist must be sufficiently transparent to allow most of the laser radiation to pass through without appreciably decomposing the coating so as to provide heating of the metal surface in the intended ablation patch area.

However, it has now been discovered that additional attributes are necessary. Through continued investigation, the present invention has found that in order for a resist coating to be removed by the above mentioned energy efficient process, it must have additional attributes such that the resist coating will:

a) soften enough when heated by the laser heated metal substrate surface to allow stretch tearing at the patch peripheral boundary between heated and non-heated material to insure patch removal;
b) not soften so much when heated by the laser heated metal substrate surface so that "balloon burst" failure occurs, i.e. rupture tear failure of the center of the ballooning heated patch first, thus relieving blister pressure and allowing the patch edges to fall back into the intended ablation patch area;
c) adhere strongly to the metal substrate so that the resulting resist sidewall bordering the removed areas maintains a sharply defined profile with no undercutting or breaking thereof;
d) provide excellent edge coverage; and
e) possess a high flash point, i.e. outside flammable category.

as well as preserve the previously established requirements that the resist coating will:

a) be sufficiently transparent to allow most of the laser radiation to pass through the coating so as to provide heating of the metal surface in the intended ablation patch area;
b) gasify enough when in contact with the laser heating metal substrate surface to provide an expulsion means for the patch being removed;
c) adhere strongly enough to protect the covered surface during plating operations;
d) not deteriorate in the plating bath chemical environment;
e) be strippable after the plating operation is completed; and
f) be able to be applied by spraying or printing.

As a result of the improved formulation, the plating resist hereof provides for a superior performance, the manner of which will become apparent from a reading of the specification which follows.

SUMMARY OF THE INVENTION

This invention is directed to a plating resist which permits its selective removal by a laser ablation technique or an energy efficient laser assisted "patch blowoff" process that exhibits improved properties with regard to:

a) handling characteristics by being classified as non-flammable,
b) edge coverage of object being resist coated,
c) adhesion to the substrate, and
d) maintenance of resist edgewall profile integrity along removed patch boundaries;

and to the preferred method in using same to selectively plate a metal substrate, such as a nickel plated, electrically conductive metal. The method comprises the steps of spraying or printing a thin uniform layer of said resist onto said substrate and drying same in situ to a thickness of greater than 100 microinches and less than 500 microinches, where said resist is resistant to chemical plating solutions, is readily strippable in alkaline solutions, and has a flashpoint in excess of 100° F. A preferred formulation for such resist comprises, by weight, the following:

| | |
|---|---|
| Styrene acrylic co-polymer suspension | 61.5% |
| Butyl cellosolve | 3.1% |
| Butyl carbitol | 7.4% |
| Water, essentially the balance. | |

Thereafter, selected areas of said resist coated substrate are subjected to a controlled excimer laser pulse to remove the resist within said areas, following by plating the exposed areas of said substrate with a precious metal, and stripping said resist from the remaining portions of said metal substrate.

DETAILED DESCRIPTION OF PREFERRED EMBODIMENT

This invention, in its preferred embodiment, is directed to an improved formulation for a plating resist, and to a method of using same in the selective plating of a metal substrate, such as an electrical contact or continuous strip of stamped and formed contacts A significant characteristic of such improved formulation is that it may be defined as non-flammable; this is by virtue of its "flashpoint" being above 100° F. This is a significant development as OSHA regulations establish handling or use requirements that are particularly stringent for "flammable" materials, i.e. those materials having a "flashpoint" below 100° F. It will be appreciated that for a commercial operation using "flammable" materials, considerable attention, time and effort must be given to various safety precautions and equipment. However, by being able to shift from "flammable" to "combustible", the next higher classification, significant commercial advantages can be gained by the removal of certain operating restrictions.

It will be understood that in the selective plating of electrical contacts, for example, the major cost, and hence the area for potential savings, lies in the precious metal deposition step. The entire operation is motivated by the need to improve techniques so as to be able to minimize gold use, by way of example, and to limit the deposition thereof to only the contact areas.

It has been discovered that the improved formulation for the resist hereof possesses a higher molecular weight than other known polymer resists, which may account in part for its better adhesion to the metal substrate, and to its superior edge coverage. In any case, this means that gold deposition on substrate edges is essentially eliminated. Further, by virtue of its improved adhesion to the metal substrate, the resist profile through the laser processed areas reveals a sharply defined sidewall with no undercutting or breaking thereof. That is, until time for the stripping takes place, the integrity of the resist is maintained. These improved characteristics are achieved with a preferred resist formulation comprising, by weight, the following:

| Styrene acrylic co-polymer suspension* | 61.5% |
|---|---|
| Butyl cellosolve | 3.1% |
| Butyl carbitol | 7.5% |
| Water, essentially the balance. | |

*a reaction mixture of about 90% of Jonacryl-56 and about 10% of Jonacryl-585, produced by S. C. Johnson Company, Racine, Wisconsin It is contemplated that variations may be made to this formulation; however, an increase or decrease of as little as 4% in the amount of Jonacryl-56 in the reaction mixture may be damaging. Nonetheless, variations are acceptable to the extent that the "flashpoint" thereof is not significantly lowered to below about 100° F.

The unique features of the plating resist of this invention can best be appreciated by reviewing the preferred process of using same. Specifically, such resist must be capable (I) of being selectively removed by focusing a laser beam thereon, (2) resistant to the chemical plating environment wherein plating of the ablated areas takes place, and (3) readily removed after the chemical plating of the ablated areas is complete by an alkaline solution as known in the art. The resist of this invention possesses these qualities as well as the further qualities noted above.

In any case, with the plating resist in place and suitably dried on the metal substrate, selected areas thereof may be subjected preferably to an excimer laser pulse or pulses. Excimer lasers for example, form a group of pulsed high-pressure gas lasers which emit various ultraviolet wavelengths, depending on the lasing medium, such as 193 nm, 248 nm, 308 nm and 351 nm.

It is important to the success of the method hereof that the proper laser and wavelength range be coordinated with both the metal substrate and the plating resist. Since it is necessary that the laser energy be absorbed mostly in the resist for the traditional ablation process method, and mostly in the substrate for the energy efficient "patch blowoff" process, as preferred herein. The absorbing tendencies of the resist vary with wavelength, so a suitable wavelength must be selected for the process intended. In the energy efficient "patch blow-off" method, the plating resist of this invention must possess a low optical absorption coefficient, e.g. with absorption coefficient preferably no greater than about 1000cm-1 for a 150 microinch coating thickness, so as to transmit the laser energy therethrough.

The theory supporting the proposition that the laser energy must be absorbed at the metal substrate is set forth below. It is theorized that most of the laser energy goes through the resist to the substrate, preferably a nickel plated substrate. There, about 55% is absorbed in roughly 30 nm of metal. For an energy density below about 1.8 J/cm$^2$, the nickel evidently remains below its melting point (1455° C.), but nevertheless transfers enough energy to a thin adjoining layer of resist to vaporize it. This simultaneously destroys the bonding layer holding the resist to the nickel, and supplies the expanding vapor needed to drive the remaining solid resist away from the surface. For higher energy densities, the bonding layer is likewise destroyed. However, a superficial layer of nickel melts resulting in a reflowing of the nickel over the substrate. Thus, depending on what is to be achieved with the underlying nickel substrate, there is latitude with regard to the laser energy densities. For single shot resist removal, energy densities of at least about 0.90 J/cm$^2$ are required Between about 0.90 and 2.5 J/cm$^2$, little change to the surface of the nickel substrate is expected. At a higher energy density (3.0 J/cm$^2$), or multiple shots, polishing of the nickel substrate may be expected. And, with such polishing the quality of the plating, by reducing substrate porosity, will be observed. To review, an energy density level of at least about 0.90 J/cm$^2$ is needed to achieve single shot removal of the plating resist of 150 microinches thickness. However, to affect the surface characteristics of the plated substrate, higher energy densities, on the order of about 2.5 J/cm$^2$, or higher, are required.

With the selected areas suitably removed by one of the methods described above, the resist coated metal substrate may be subjected to metal plating. Since, as noted above, the plating step is a chemical process which can attack the resist coating, resistance to such attack is important. The plating resist of this invention is particularly resistant to such attack by either of the conventional plating techniques, i.e. immersion plating and electrolytic plating. Since immersion plating is very sensitive to surface contaminants, such as oxides or organic contaminants, a desirable treatment is to first immerse the resist coated and laser processed substrate in an activation solution to remove surface oxides and contaminants prior to plating, such as with gold. Thereafter, such substrate can be immersion plated in a Technic Oromerse "N", a gold plating solution, for 90 seconds at about 80° C., and removed.

Electrolytic plating, another plating method, may be used to obtain a thick hardened gold plating. To clean and activate the surface, an activation bath, such as described above is recommended. In such cleaned conditions, the substrates can then be electroplated in a bath having the following parameters:

| * | gold concentration | 2 tr. oz./gal |
|---|---|---|
| * | nickel concentration | 2100 ppm |
| * | pH | 4.6–4.8 |
| * | temperature | 120° F. |
| * | efficiency @ 40 ASF and 120° F. | 40 50% |

With such plating parameters, a gold deposit thickness of 30 microinches can be achieved in a dwell time of from 45 to 60 seconds. By either practice, suitable gold plating may be achieved on the laser processed areas.

The final step is the removal or stripping of the remaining plating resist from the metal substrate by a cathodic removal process. In a preferred practice, this is accomplished by passing said resist coated metal substrate through an alkaline solution, such as sodium hydroxide, maintained at a pH of about 9.5, a temperature of about 140° F., a voltage of about 2 volts, for about one minute, and drying the resist-free metal substrate.

I claim:

1. A method for the selective plating of a nickel plated electrically conductive substrate, comprising the steps of applying a thin, uniform layer of a resistant containing styrene acrylic co-polymer, butyl cellosolve, butyl carbonil, and water, and possessing a flashpoint of no less than 100° F., onto said substrate, drying said resist in situ, where said dried resist is (a) highly transparent to the wavelength of an excimer laser operating in the U.V. range so that the laser energy may be absorbed by said metal substrate, and (b) resistant to deterioration in chemical plating solutions, subjecting selected areas of said dried resist to a controlled excimer laser pulse to remove the resist within said areas, plating the exposed areas of said substrate with a precious metal, and stripping said resist from the remaining portions of said metal substrate.

2. The method according to claim 1 wherein said excimer laser wavelength is 248 nm.

3. The method according to claim 1 wherein said excimer laser wavelength is 308 nm.

4. The method according to claim 1 wherein said excimer laser wavelength is 351 nm.

5. The method according to claim 1, wherein said resist is in the dried state has a thickness between about 100 and 500 micro inches.

* * * * *